(12) United States Patent
Arimura

(10) Patent No.: US 7,856,046 B2
(45) Date of Patent: Dec. 21, 2010

(54) SURFACE EMITTING LASER DIODE INCLUDING GRATING LAYER

(75) Inventor: Soichiro Arimura, Kyoto (JP)

(73) Assignee: Rohm Co., Ltd., Kyoto-fu (JP)

( * ) Notice: Subject to any disclaimer, the term of this patent is extended or adjusted under 35 U.S.C. 154(b) by 112 days.

(21) Appl. No.: 12/289,881

(22) Filed: Nov. 6, 2008

(65) Prior Publication Data

US 2009/0116527 A1 May 7, 2009

(30) Foreign Application Priority Data

Nov. 6, 2007 (JP) .............................. 2007-288338

(51) Int. Cl.
*H01S 3/08* (2006.01)
(52) U.S. Cl. ............... 372/102; 372/45.01; 372/45.012; 372/50.124; 372/66; 372/67
(58) Field of Classification Search ............. 372/45.01, 372/45.012, 50.124, 66, 67, 102
See application file for complete search history.

(56) References Cited

U.S. PATENT DOCUMENTS

| | | | | |
|---|---|---|---|---|
| 5,343,490 A | * | 8/1994 | McCall | ......................... 372/94 |
| 5,790,583 A | * | 8/1998 | Ho | .............................. 372/92 |
| 5,878,070 A | * | 3/1999 | Ho et al. | ......................... 372/92 |
| 7,242,705 B2 | * | 7/2007 | Kneissl et al. | ................. 372/67 |
| 2005/0135453 A1 | * | 6/2005 | Kneissl et al. | ................. 372/94 |
| 2007/0086496 A1 | * | 4/2007 | Tanaka et al. | ............ 372/43.01 |
| 2007/0153864 A1 | * | 7/2007 | Lidorikis et al. | ........ 372/50.124 |

OTHER PUBLICATIONS

R. Dorn et al. "Sharper Focus for a Radially Polarized Light Beam". Physical Review Letters vol. 91 No. 23, 2003, p. 233901.
S. Quabis at al., "Focusing Light to a Tighter Spot". Optics Communications, 2000, pp. 1-7, vol. 179, ELSEVIER.

* cited by examiner

*Primary Examiner*—Minsun Harvey
*Assistant Examiner*—Yuanda Zhang
(74) *Attorney, Agent, or Firm*—Rabin & Berdo, PC

(57) ABSTRACT

A surface emitting laser diode includes a ring-shaped first semiconductor layer including an n-type clad layer, a ring-shaped active layer provided on the first semiconductor layer, and a ring-shaped second semiconductor layer which is provided on the active layer and includes a p-type clad layer and a grating layer including grating units continuously arranged in a circumferential direction, each grating unit including a plurality of regions having different refractive indices and being adjacent to each other in the circumferential direction.

16 Claims, 11 Drawing Sheets

(a)  (b)

US 7,856,046 B2

SURFACE EMITTING LASER DIODE INCLUDING GRATING LAYER

CROSS REFERENCE TO RELATED APPLICATIONS AND INCORPORATION BY REFERENCE

This application is based upon and claims the benefit of priority from prior Japanese Patent Application P2007-288338 filed on Nov. 6, 2007; the entire contents of which are incorporated by reference herein.

BACKGROUND OF THE INVENTION

1. Field of the Invention

The present invention relates to a laser diode formed on a semiconductor substrate and specifically relates to a surface emitting laser diode emitting light in a direction perpendicular to the semiconductor substrate.

2. Description of the Related Art

Semiconductor lasers and the like include laser diodes each having a plurality of nitride compound semiconductor layers and the like stacked on a semiconductor substrate. Among such laser diodes, a laser diode having a structure emitting light in a direction perpendicular to the semiconductor substrate is called a surface emitting laser diode, and a surface emitting laser diode including a resonator arranged perpendicularly to the semiconductor substrate is called a "vertical cavity surface light emitting laser (VCSEL)". The surface emitting laser diode has excellent characteristics such as low threshold operation, emission of a circular narrow beam, and easy production of a two-dimensional array and is applied to various fields such as high speed optical communications.

As an application example, if the beam polarization of the laser diode can be controlled into a certain shape, the spot size of the output light can be made small. Accordingly, the possibilities of further applications to high density recording and reading optical pickup light sources are being examined. For example, a small spot size beam polarized in the optical axis direction can be obtained by condensing by use of an aperture only light which is polarized in a direction perpendicular to an optical axis direction and transmitted through edge part of a high NA lens.

However, such a method of transmitting light through a plurality of optical devices to generate light polarized perpendicularly to the optical axis direction and reducing the spot size of the generated polarized light by means of the aperture increases the size and cost of a laser generator.

Moreover, the VCSEL has a structure which includes a resonator layer sandwiched by distributed Bragg reflectors (DBRs) parallel to the substrate. Because of the structure including the DBR, the VCSEL has low heat radiation performance. Accordingly, an increase in power of the VCSEL needs to be suppressed, or the reliability thereof is degraded.

SUMMARY OF THE INVENTION

An aspect of the present invention is a surface emitting laser diode. The surface emitting laser diode includes a ring-shaped first semiconductor layer including an n-type clad layer; a ring-shaped active layer provided on the first semiconductor layer; and a ring-shaped second semiconductor layer which is provided on the active layer and includes a p-type clad layer and a grating layer including grating units continuously arranged in a circumferential direction, each grating unit including a plurality of regions having different refractive indices and being adjacent to each other in the circumferential direction.

DETAILED DESCRIPTION OF THE INVENTION

Figure 1:
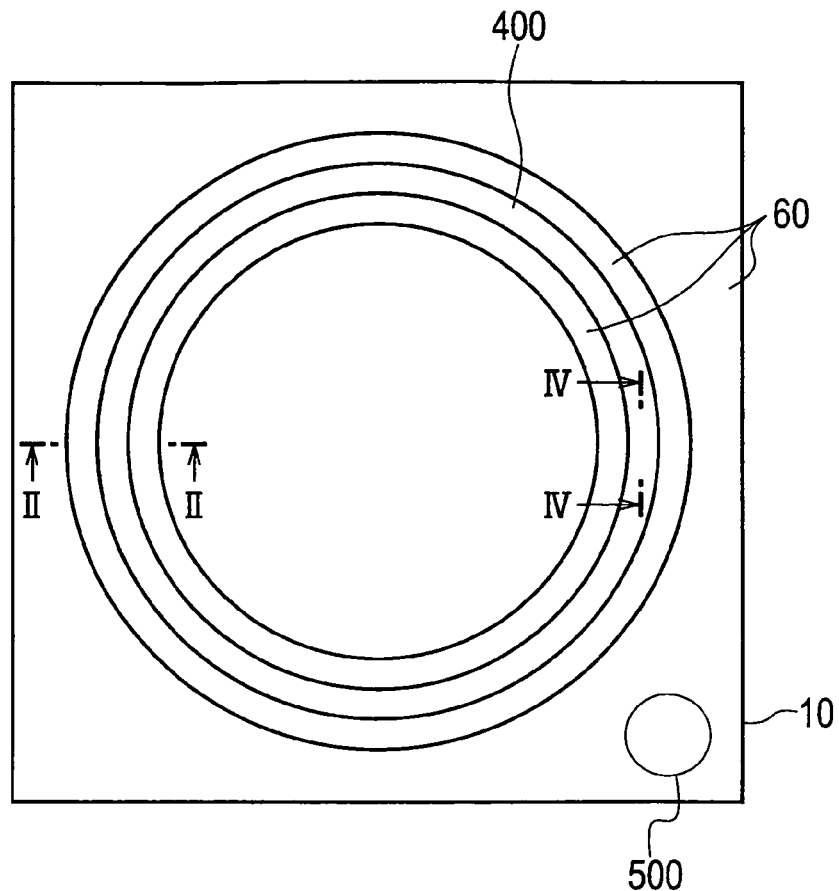
FIG. 1 is a schematic top view of a surface emitting laser diode according to an embodiment of the present invention.

An embodiment of the present invention will be described with reference to the accompanying drawings. In the following description of the drawings, the same or similar reference numerals are applied to the same or similar parts and elements. It is to be noted that the drawings are schematic and have different relationship between thickness and planer dimensions, proportions of thickness of layers, and the like from the real ones. Accordingly, specific thicknesses and dimensions should be determined with reference to the following description. Moreover, it is obvious that some parts have different dimensional relationships or proportions throughout the drawings.

The following embodiment just shows devices and methods to embody the technical idea of the present invention, and the technical idea of the present invention does not specify materials, shapes, structures, and arrangements of the constituent components and the like to the following description. The technical idea of the present invention can be variously modified in the scope of claims.

Figure 2:
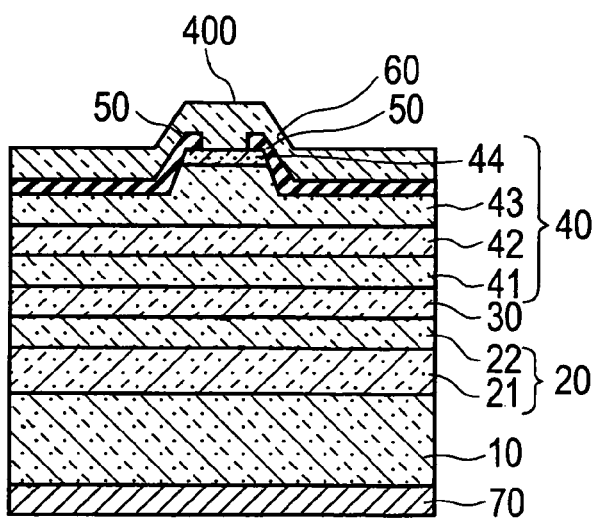
FIG. 2 is a schematic view showing a section along a direction II-II of the surface emitting laser diode shown in FIG. 1.

FIG. 1 shows a top view of a surface emitting laser diode according to the embodiment of the present invention, and FIG. 2 shows a section of the same in a direction II-II of FIG. 1. The surface emitting laser diode shown in FIGS. 1 and 2 includes: a substrate 10; a ring-shaped first semiconductor layer 20 which is provided on a main surface 11 of the substrate 10 and includes an n-type clad layer 21; a ring-shaped active layer 30 provided on the first semiconductor layer 20; and a ring-shaped second semiconductor layer 40 provided on the active layer 30. The second semiconductor layer 40 includes a p-type clad layer 43 and a grating layer 42. The grating layer 42 includes grating units continuously arranged in a circumferential direction. Each grating unit includes a plurality of regions which are adjacent in the circumferential direction and have different refractive indices. When generating a below-mentioned radially polarized beam (RPB) by the present invention, the arrangement pitch of the grating units, which is defined as a product of an angle between lines extending from a center of the second semiconductor layer 40 to two adjacent grating units and a radius of the second semiconductor layer 40a, is set to $2\pi/\beta$ ($\pi$: pi). Herein, $\beta$ is a propagation coefficient of light which is generated at the active layer 30 and propagates in the grating layer 42 in the circumferential direction thereof.

The substrate 10 can be a gallium nitride (GaN) substrate or the like, for example.

As shown in FIG. 2, the first semiconductor layer 20 further includes an n-type guide layer 22 arranged between the n-type clad layer 21 and active layer 30. The second semiconductor layer 40 further includes a p-type electron block layer 41 and a p-type contact layer 44. The p-type electron block layer 41, grating layer 42, p-type clad layer 43, and p-type contact layer 44 are sequentially stacked on the active layer 30.

The n-type clad layer 21 and the p-type clad layer 43 are formed to provide an "optical confinement effect" which confines light generated at the active layer 30 therebetween through a difference in refractive index therebetween. The band gaps of the n-type clad layer 21 and the p-type clad layer 43 are set wider than the band gap of the active layer 30. Substances having narrower band gaps tend to have larger lattice constants. Accordingly, there is a lattice mismatch between the active layer 30 and neighboring layers of the active layer 30, thus causing compressive strain at the active layer 30. In other words, the active layer 30 includes such strain that shortens the grating period.

The first semiconductor layer 20, active layer 30, and second semiconductor layer 40 are grown on the main surface 11 of the substrate 10 by metal organic chemical vapor deposition (MOCVD) or the like. Current is applied between a p-side electrode 60 and an n-side electrode 70, and electrons are injected from the first semiconductor layer 20 into the active layer 30. Holes are injected from the second semiconductor layer 40 into the active layer 30. The injected electrons and holes are recombined at the active layer 30 to generate light. The light generated by recombination of electrons and holes is amplified in the active layer 30.

The active layer 30 can have a quantum well (QW) structure including, for example, a plurality of barrier layers composed of indium gallium nitride (InGaN) and a light emitting layer which is arranged between the barrier layers and has a band gap smaller than the band gap of the barrier layer. For example, several pairs of the light emitting layers composed of 3 nm thick InGaN layers and the barrier layers composed of 7 nm thick InGaN layers doped with silicon (Si) are alternately stacked to form the active layer 30 of a multiple quantum well (MQW) structure.

Wavelength of light generated at the active layer 30 (emission wavelength) is set to, for example, about 400 to 550 nm by adjusting the compositional ratio of indium (In). The quantum well layer may be configured so that the light emitting layer is composed of an InGaN layer having a compositional ratio of In of not less than 5% and having a comparatively small band gap and the barrier layers are composed of GaN layers with a comparatively large band gap.

The n-type clad layer 21 is formed to provide the "optical confinement effect" as already described. The n-type clad layer 21 is doped with Si as an n-type dopant. The n-type clad layer 21 can have a superlattice structure including a plurality of AlGaN and GaN layers alternately stacked on each other. For example, the n-type clad layer 21 includes 260 pairs of about 2.5 nm thick AlGaN layers and about 2.5 nm thick GaN layers stacked on each other.

The n-type guide layer 22 is a semiconductor layer to provide a "carrier confinement effect" which confines carriers (electrons and holes) within the active layer 30. Because of the carrier confinement effect, the efficiency of recombination of electrons and holes at the active layer 30 can be increased. The n-type guide layer 22 is composed of an about 60 nm thick GaN layer doped with Si as an n-type dopant.

The p-type electron block layer 41 prevents electrons from flowing out of the active layer 30 and increases the efficiency of recombination of electrons and holes at the active layer 30. The p-type electron block layer 41 is composed of, for example, an about 13 nm thick AlGaN layer doped with magnesium (Mg) as a p-type dopant.

The grating layer 42 is provided to allow the surface emitting laser diode shown in FIG. 1 to serve as a ring resonator and extract light propagating within the ring resonator in a perpendicular direction to the main surface 11 of the substrate 10. By providing a grating satisfying a certain condition for the light guide layer, it is possible to constitute a resonator selectively emitting light of a specific wavelength and provide light with a single emission wavelength. The detailed description of the grating layer 42 is described later.

The p-type clad layer 43 is formed to provide the "optical confinement effect" already described. The p-type clad layer 43 is doped with Mg or the like as a p-type dopant. The p-type clad layer 43 can have a superlattice structure including a plurality of AlGaN and GaN layers alternately stacked on each other or the like. For example, the p-type clad layer 43 is composed of 85 pairs of about 2.5 nm thick AlGaN layers and about 2.5 nm thick GaN layers stacked on each other.

The p-type contact layer 44 is a low resistance layer to reduce electrical resistance between the second semiconductor layer 40 and p-side electrode 60. The p-type contact layer 44 is composed of, for example, an about 60 nm thick GaN layer doped with a high concentration of Mg as a p-type dopant.

As shown in FIG. 2, upper part of the second semiconductor layer 40, or specifically edges of part of the p-type contact layer 44 and the p-type clad layer 43 are etched in the circumferential direction to form a ridge 400.

On the p-type contact layer 44, an insulating film 50 is provided. The p-side electrode 60 is provided on the insulating film 50 and is connected to the p-type contact layer 44 through an opening provided for the insulating film 50. As shown in FIG. 1, the p-side electrode 60 covers the entire surface emitting laser diode including the main surface 11 of the substrate 10, and the insulating film 50 is provided so as to cover the exposed surface of the p-type clad layer 43 so that the p-side electrode 60 is in contact only with the p-type contact layer 44 at the top of the ridge 400. Current is therefore concentrated on the ridge 400, thus allowing efficient laser oscillation. Since the surface of the ridge 400 is covered and protected with the insulating film 50 except the part in contact with the p-side electrode 60, the optical confinement can be less severe in the lateral direction, thus facilitating the control of the laser oscillation. Moreover, it is possible to prevent leak current from the side faces.

The n-side electrode 70 is provided in contact with a main surface of the substrate 10 opposite to the main surface 11. The n-side electrode 70 is placed on a metallic pattern on a not-shown wiring substrate by die bonding. A bonding pad 500 provided on the p-side electrode 60 and the wiring substrate are electrically connected by a bonding wire.

The p-side electrode 60 can be a transparent electrode composed of, for example, zinc oxide (ZnO), indium-tin oxide (ITO), or the like. The n-side electrode 70 can be, for example, an aluminum (Al) film, an Al-titanium (Ti)-gold (Au) stack, or the like. The insulating film 50 can be, for example, an about 100 nm thick zirconia ($ZnO_2$) film, a silicon oxide ($SiO_2$) film, or the like.

Figure 3:
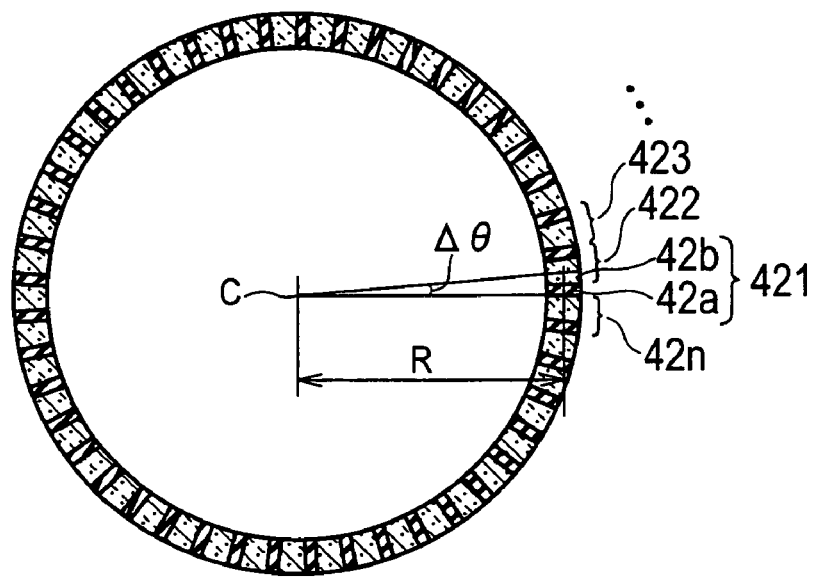
FIG. 3 is a schematic view showing a section of a grating layer of the surface emitting laser diode according to the embodiment of the present invention, the section being parallel to a substrate.

FIG. 3 shows a section of the grating layer 42 parallel to the main surface 11 of the substrate 10. As shown in FIG. 3, the grating layer 42 has a structure in which n grating units 421 to 42n are continuously arranged in the circumferential direction (n is an integer not less than 2).

Figure 4:
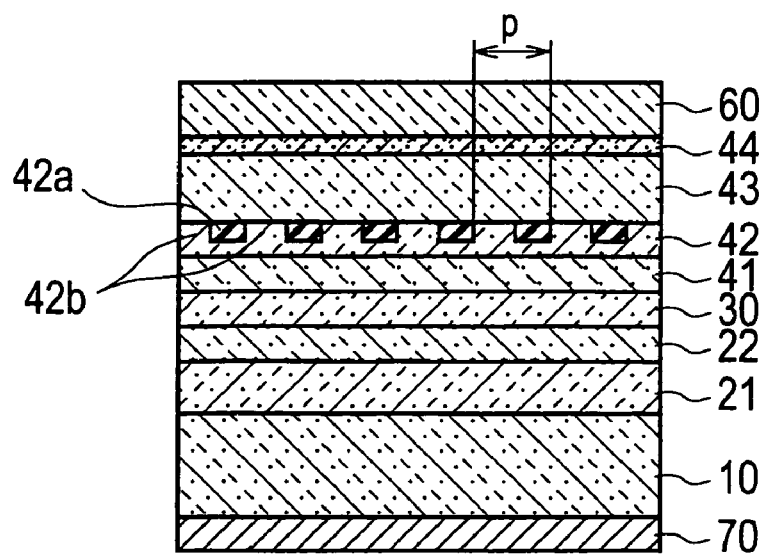
FIG. 4 is a schematic view showing a section of the surface emitting laser diode shown in FIG. 1 in a direction IV-IV.

FIG. 4 shows a section in a direction IV-IV of FIG. 1. As shown in FIGS. 3 and 4, the grating layer 42 includes first regions 42a and second regions 42b individually provided between adjacent pairs of the first regions 42a. The first regions 42a have a first refractive index n1, and the second regions 42b have a second refractive index n2 which is different from the first refractive index n1. In other words, the grating layer 42 is composed of a semiconductor layer which has the first refractive index n1 and includes a plurality of stripe recesses extending in a radial direction of the second semiconductor layer 40 in the surface thereof and a semiconductor layer which has the second refractive index n2 and is embedded in the recesses. Herein, the radial direction is a direction extending from the center to each point on the circumference.

Specifically, each of the grading units 421 to 42n includes the first region 42a having the first refractive index n1 and the second region 42b having the second refractive index n2, which is different from the first refractive coefficient, and the first and second regions 42a and 42b are adjacent to each other in the circumferential direction. Accordingly, the grating layer 42 serves as a grating refractive index waveguide with the refractive index varying in the circumferential direction. In the grating refractive index waveguide, the first and second regions 42a and 42b are alternately arranged.

Specifically, the first regions 42a are composed of spin-on-glass (SOG) having a specific refractive index of about 1.4 to 1.6, and the second regions 42b are composed of GaN or AlGaN with a specific refractive index of about 2.6, for example. The refractive index of AlGaN depends on the composition. Accordingly, the first regions 42a may be composed of GaN while the second regions 42b are composed of AlGaN having a refractive index different from GaN. Preferably, the ratio of circumferential width of each first region 42a to that of each second region 42b is about 1/1. The method of forming the grating layer 42 is described later.

The arrangement pitch p of the grating units 421 to 42n is defined as a product of a radius R of curvature of the second semiconductor layer 40 and an acute angle Δθ between straight lines extending from a center C of the second semiconductor layer 40 shown in FIG. 3 to the grating units 421 and 422 adjacent to each other. When generating a below-mentioned radially polarized beam (RPB) by the present invention, it is preferable that the arrangement pitch p is 2π/βd for the propagation coefficient βd of light which is generated at the active layer 30 and propagates in the grating layer 42 in the circumferential direction.

The radius R of curvature is, for example, a distance from the center C to the intermediate point between outer and inner circumstances of the grating units 421 to 42n. The propagation coefficient βd is a propagation coefficient at the surface emitting laser diode serving as a ring resonator, which is shown in FIGS. 1 and 2. The propagation coefficient βd is about 2πn/λ where λ is a wavelength of light in vacuum and n is an effective refractive index of the ring resonator.

For example, when wavelength of light generated at the active layer 30 is about 400 nm and the grating layer 42 is composed of SOG with a specific refractive index of about 1.4 to 1.6 and GaN or AlGaN with a specific refractive index of about 2.6, it is convenient for generating the RPB that the arrangement pitch p of the grating layer 42 is about 160 nm.

A description is given below of an operation of the surface emitting laser diode which is shown in FIG. 1 and serves as the ring resonator. The ring resonator is a resonator including like a curved waveguide with both ends joined into a circular waveguide. As already described, the active layer 30 provided in adjacent to the layers with wide band gaps includes compressive strain. Accordingly, in the light generated at the active layer 30, the gain of the TE mode with the electric field polarized parallel to the main surface 11 of the substrate 10 is larger than that of the TM mode with the electric field polarized perpendicularly to the main surface 11. Herein, the "mode" indicates a state of light, and the polarization direction is one of the indices specifying the mode.

Figure 5:
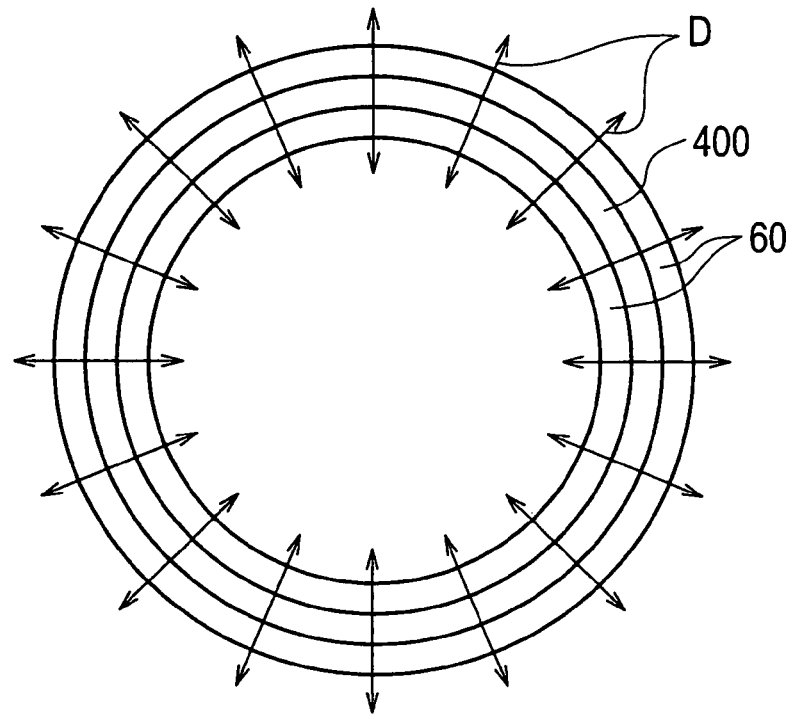
FIG. 5 is a schematic view showing a polarization direction of light propagating in the surface emitting laser diode according to the embodiment of the present invention.

When the active layer 30 includes compressive strain, the gain of the TE mode is larger than that of the TM mode, and the TE mode oscillation is more likely to occur. Accordingly, light propagating in the grating layer 42 in the circumferential direction (propagating light) is polarized in a direction which is perpendicular to the propagating direction and parallel to the main surface 11 of the substrate 10. In other words, the guided mode of the propagating light is the TE mode. When the guided mode of the propagating light is the TE mode, a mode with the electric field polarized parallel to the radial direction as shown in FIG. 5 (hereinafter, referred to as a "ring resonator internal mode") is formed within the ring resonator. In FIG. 5, a polarization direction D is indicated by an arrow.

In a general ring resonator, the propagation coefficient β of light propagating along the circumference of the ring part serving as a curved waveguide with a constant radius R of curvature is defined. The propagation coefficient β of light capable of resonating in the ring resonator satisfies the condition of the following equation (1):

$$R\beta = m \quad (1)$$

In the equation (1), m is a natural number. Light with a propagation coefficient βlaser whose gain is the largest in light with the propagation coefficient β satisfying the equation (1) selectively oscillates in the ring resonator.

Next, a description is given of emission of the surface emitting laser diode according to the embodiment of the present invention. The mode of light outputted from the surface emitting laser diode shown in FIG. 1 is referred to as a "radiation mode" below.

First, the case where the RPB is generated by the present invention is explained. The arrangement pitch p of the grating units 421 to 42n is set equal to $2\pi/\beta d$ when the propagation coefficient of light propagating in the grating layer 42 in the circumferential direction is $\beta d$. The propagation coefficient $\beta d$ is expressed by the following equation (2) using the acute angle $\Delta\theta$ and radius R of curvature shown in FIG. 3:

$$\beta d = 2\pi/p = 2\pi/(\Delta\theta \times R) \tag{2}$$

When the propagation coefficient $\beta d$ of light propagating in the ring resonator is $\beta$laser, the ring resonator internal mode with the propagation coefficient $\beta$laser is coupled to the radiation mode in a direction perpendicular to the main surface 11 of the substrate 10 because of the effect of grading (pitch: $1/\beta d$) of the grating layer 42. Herein, "mode coupling" means allowing light (photons) in a certain mode to be transferred to another mode.

Generally, light propagating in a ring resonator in the circumferential direction is not outputted in the direction perpendicular to the main surface 11 of the substrate 10. However, in the surface emitting laser diode shown in FIG. 1, by forming the grating structure of the grating layer 42 so that the equations (1) and (2) are satisfied, light circulating within the ring resonator is diffracted in the direction perpendicular to the main surface 11. Because of the diffraction effect of the grating, the ring resonator internal mode is coupled to the radiation mode in the direction perpendicular to the main surface 11. Moreover, even if $\beta d$ and $\beta$laser are not completely equal to each other but are substantially equal to each other, the ring resonator internal mode is also coupled to a radiation mode in the direction slightly away from the direction perpendicular to the main surface 11.

Figure 6:
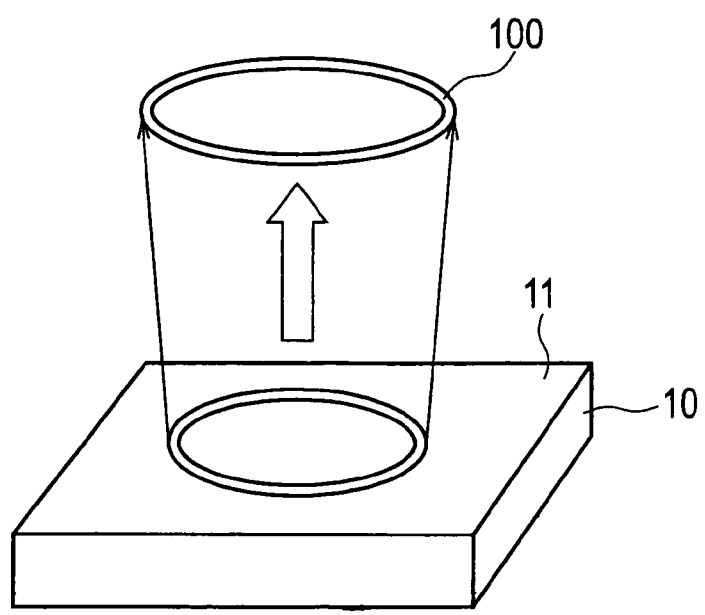
FIG. 6 is a schematic view showing output light from the surface emitting laser diode according to the embodiment of the present invention.
Figure 7:
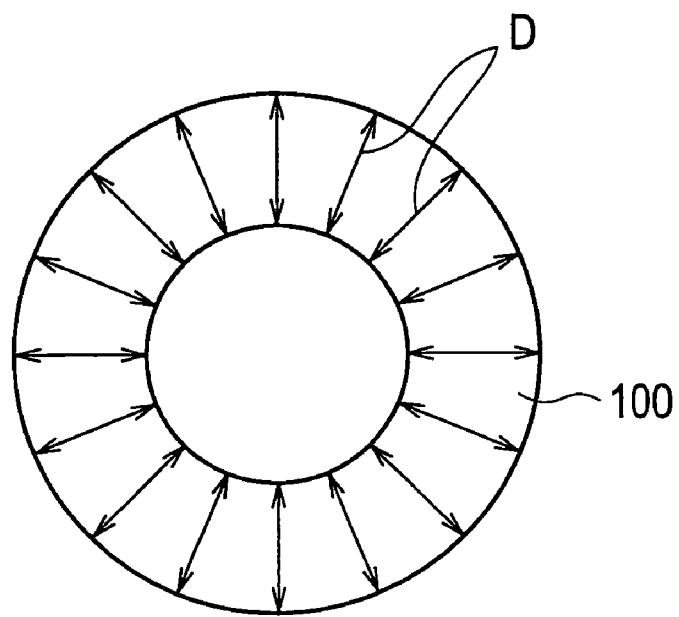
FIG. 7 is a schematic view showing the polarization direction of the output light from the surface emitting laser diode according to the embodiment of the present invention.

Accordingly, light propagating in the surface emitting laser diode shown in FIG. 1 in the circumferential direction is outputted in the direction perpendicular to the main surface 11 of the substrate 10 with the direction of oscillation of the electric field being unchanged. As a result, an annular beam 100 polarized in a radial direction perpendicular to the main surface 11 of the substrate 10 (the radially polarized beam (RPB)) is outputted from the surface emitting laser diode as shown in FIG. 6. As shown in FIG. 7, the RPB 100 is a beam polarized radially around the center thereof, and the polarization direction D of the RPB 100 is a direction passing the center of the RPB 100. FIG. 7 shows the RPB 100 in a direction perpendicular to the main surface 11 of the substrate 10. The RPB 100 is transmitted through the p-side electrode 60 and outputted through the opening provided for the insulating film 50.

Figure 8:
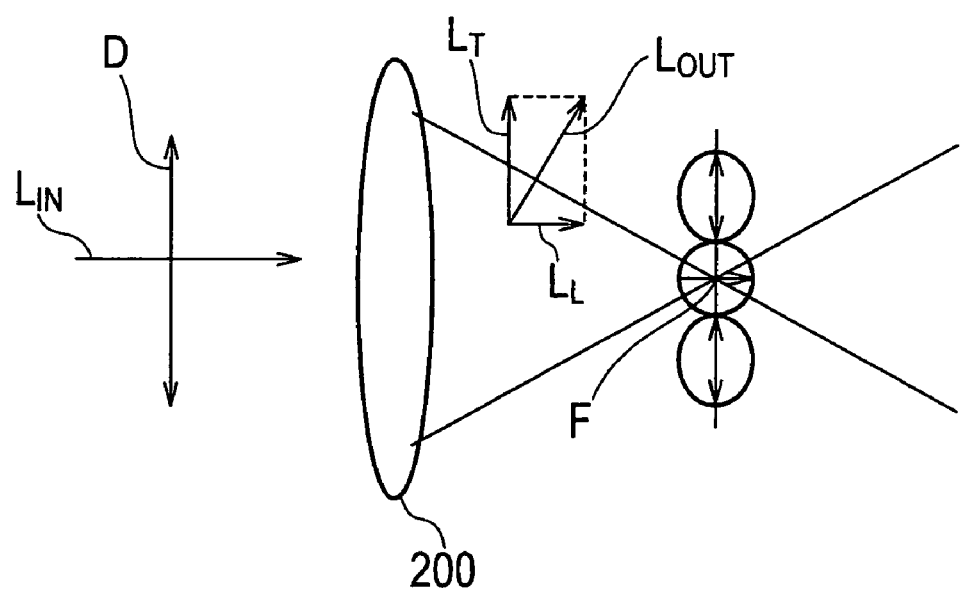
FIG. 8 is a schematic view showing an example of a method of obtaining output light including a polarization component parallel to an optical axis on the optical axis.

With reference to FIG. 8, a description is given of a method of condensing input light $L_{IN}$ using a lens 200 to obtain output light $L_{OUT}$ including a large amount of polarization component parallel to the optical axis on the optical axis of the input light $L_{IN}$. As shown in FIG. 8, the output light $L_{OUT}$ obtained by condensing the input light $L_{IN}$ polarized perpendicularly to the optical axis by means of the lens 200 includes a polarization component $L_L$ parallel to the optical axis (hereinafter, referred to as a "parallel component") and a polarization component $L_T$ perpendicular to the optical axis (hereinafter, referred to as a "perpendicular component"). The output light $L_{OUT}$ having the parallel component on the optical axis is obtained at a focal point F of the lens 200.

Figure 9:
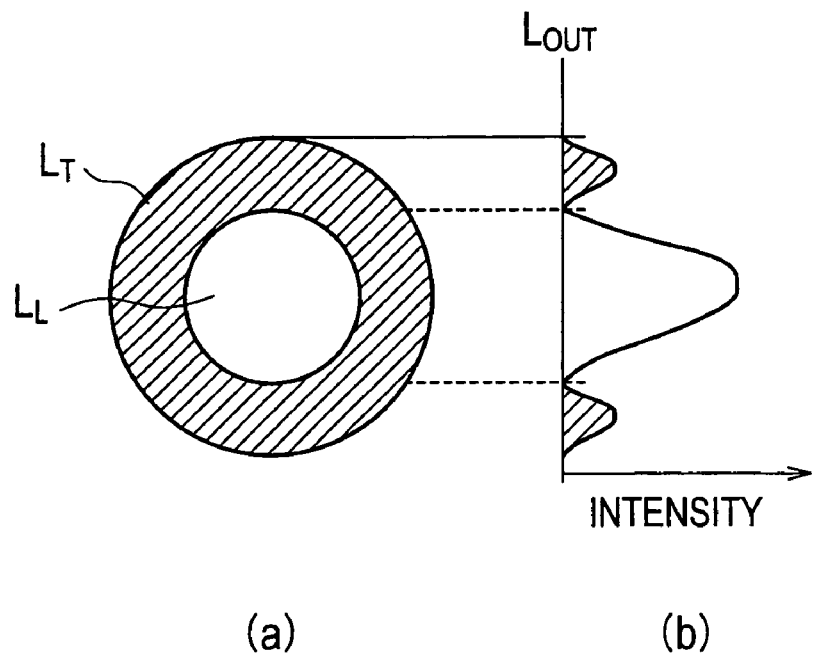
FIG. 9 is a schematic view showing a distribution of intensity of the output light shown in FIG. 8.

FIG. 9 shows a distribution of components of the output light $L_{OUT}$ at the focal point F. FIG. 9(a) shows a distribution of the output light $L_{OUT}$ viewed in the optical axis direction, and FIG. 9(b) shows an intensity distribution of the parallel component $L_L$ and perpendicular component $L_T$. In FIG. 9, the hatched part shows the distribution of the perpendicular component $L_T$. As shown in FIG. 9, the parallel component $L_L$ distributes around the optical axis, and the perpendicular component $L_T$ distributes around the parallel component $L_L$.

Figure 10:
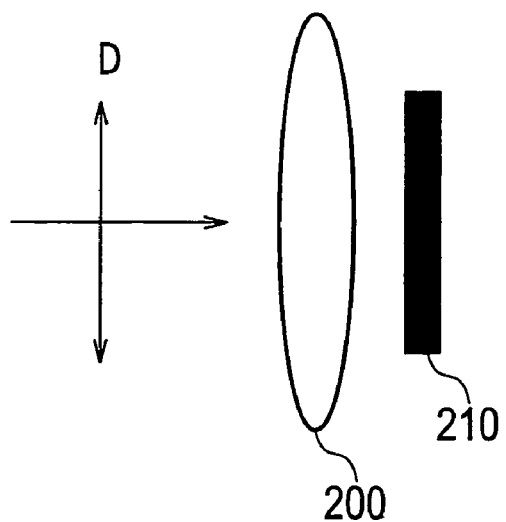
FIG. 10 is a schematic view showing an example of a method of reducing spot size of the output light by means of a related technique.

To reduce the spot size of the output light $L_{OUT}$, it is preferable to reduce the perpendicular component $L_T$ of the output light $L_{OUT}$ at the focal point F. The component of the input light $L_{IN}$ perpendicular to the optical axis is focused by the lens 200 into a component parallel to the optical axis. Accordingly, the larger the angle between a direction that the input light $L_{IN}$ travels before being incident onto the lens 200 and a direction that the light travels to the focal point F after being incident onto the lens 200, the more the parallel component $L_L$ of the output light $L_{OUT}$ already transmitted through the lens 200 is. In other words, part of the output light $L_{OUT}$ transmitted through edge part of the lens 200 includes a large amount of the parallel component $L_L$. On the other hand, the output light $L_{OUT}$ transmitted through central part of the lens 200 includes a large amount of the perpendicular component $L_T$ and a small amount of the parallel component $L_L$. As shown in FIG. 10, by providing an aperture 210 so as to cover the central part of the lens 200 and preventing part of the output light $L_{OUT}$ transmitted through the central part of the lens 200 from being condensed to the focal point F, the perpendicular component $L_T$ of the output light $L_{OUT}$ at the focal point F is reduced. The spot size of the output light $L_{OUT}$ can be therefore reduced. However, in the method shown in FIG. 10, the provision of the aperture 210 increases the size of the laser generator.

On the other hand, since the surface emitting laser diode shown in FIG. 1 outputs the RPB 100, the RPB 100 designed to have a ring size equal to the size of the lens 200 can implement the same situation as that in the case where the aperture 210 is provided. By such a measure, the annular RPB 100 including a large amount of component perpendicular to the optical axis can be transmitted through only the peripheral part of the lens 200. It is therefore possible to generate output light $L_{OUT}$ including a large amount of the parallel component $L_L$ without devices such as the aperture 210 shown in FIG. 10.

As described above, according to the surface emitting laser diode of an embodiment of the present invention, the surface emitting laser diode outputting the annular RPB 100, which is polarized in the radial direction, in the direction perpendicular to the main surface 11 of the substrate 10 can be implemented in a single chip. Accordingly, generation of light polarized perpendicular to the optical axis does not require a plurality of optical devices. Furthermore, since the surface emitting laser diode shown in FIG. 1 outputs the annular RPB 100, the spot size thereof can be reduced without the aperture 210 combined with the lens 200 shown in FIG. 10. Consequently, according to the surface emitting laser diode shown in FIG. 1, the laser generator generating the output light $L_{OUT}$ polarized in the optical axis direction is prevented from increasing in size. It is therefore possible to implement a small laser generator at low cost.

Furthermore, since the DBR provided parallel to the substrate 10 is not included unlike the VCSELs, the reduction in heat radiation due to the DBR structure is suppressed. Accordingly, the surface emitting laser diode can be configured to output high power without reducing the reliability thereof. When using the surface emitting laser diode of the embodiment of the present invention for the above-mentioned use, since the beam outputted from surface emitting laser diode may not be the RPB, there is no restriction in the arrangement pitch p of the grating units 421 to 42n.

In VCSELs, the power of emitted light can be increased by increasing electric current. However, the shape of the output light is difficult to control in such a case. Moreover, as for Fabry-Perot laser diodes, the area of the light emitting part is small, and the light density therefore significantly increases at the light emitting part, thus causing destruction and shortening the product life. On the other hand, in the surface emitting laser diode shown in FIG. 1, the magnitude of the power and the modulating speed are changed by varying the ring diameter to change in light emitting area. Specifically, the output is increased as the radius R of curvature is increased while the modulating speed is increased as the radius R of curvature is reduced. Accordingly, by properly setting the radius R of curvature, a laser diode with desired power or modulating speed can be implemented.

As described above, according to the surface emitting laser diode shown in FIG. 1, the increase in size of the laser generator can be prevented, and the reduction in heat radiation performance is suppressed. It is therefore possible to form an array with the surface light emitting diodes. Accordingly, by adding up power of the individual light emitting laser diodes arranged in an array, a high power light source can be implemented. Moreover, the surface emitting laser diodes which are configured to have different emission wavelengths can be utilized in wavelength multiplexing high density optical communications. Furthermore, the surface emitting laser diodes individually which serve as independent light sources can be therefore utilized as the light sources of laser printers and the like.

Figure 11:
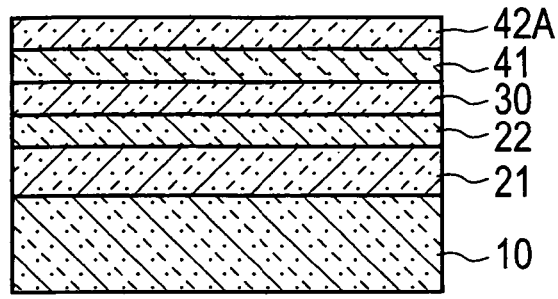
FIGS. 11 to 17 are process cross-sectional views for explaining a method of manufacturing the surface emitting laser diode according to the embodiment of the present invention.
Figure 12:
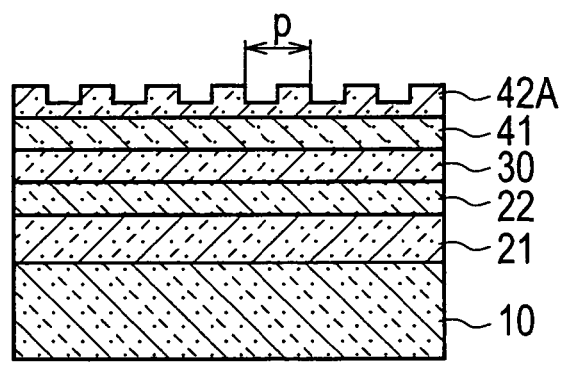
Figure 13:
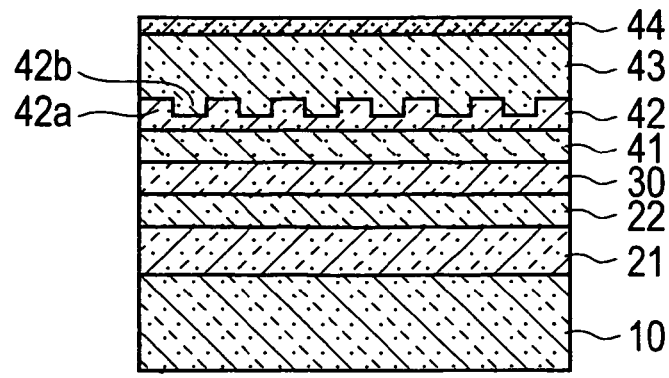
Figure 14:
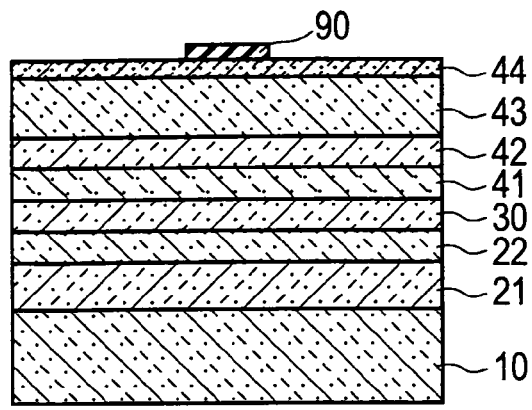

With reference to FIGS. 11 to 17, a description is given of a method of manufacturing the surface emitting laser diode according to the embodiment of the present invention. FIGS. 11 to 13 show sections in a direction IV-IV of FIG. 1, and FIGS. 14 to 17 show sections in the direction II-II of FIG. 1. The method of manufacturing the light emitting laser diode described below is just an example, and it is obvious that the surface emitting laser diode can be implemented by other various manufacturing methods including modifications of the same.

(a) The substrate 10 of a GaN substrate, for example, is prepared. The n-type clad layer 21, the guide layer 22 and the active layer 30 are sequentially stacked on the main surface 11 of the substrate 10 by MOCVD or the like. Thereafter, the p-type electron block layer 41 is formed on the active layer 30, and a GaN layer 42A as the p-type light guide layer is stacked on the p-type electron block layer 41, thus obtaining the structure section shown in FIG. 11.

(b) As shown in FIG. 12, for example, a plurality of about 60 nm deep recesses extending in the radial direction of the second semiconductor layer 40 are formed in the surface of the GaN layer 42A with a thickness of 100 nm by etching using nano-imprint, UV photolithography, electron beam lithography, or the like. When generating the RPB, since the pitch of the recesses correspond to the arrangement pitch p of the grating units 421 to 42n, the pitch of the recesses is set to $2\pi/\beta$ for the propagation coefficient βd of light propagating in the grating layer 42 in the circumferential direction. The pitch of the recesses (arrangement pitch p) is set to a value satisfying the equation (2).

(c) As shown in FIG. 13, the p-type glad layer 43 composed of AlGaN is formed by MOCVD or the like so as to fill the recesses formed in the surface of the GaN layer 42A. The grating layer 42 is thus formed in which each of the first regions 42 is composed of a part of the GaN layer 42A and each of the second regions 42b is composed of the part of AlGaN filling the recesses formed in the surface of the GaN layer 42A. Thereafter, the p-type contact layer 44 is formed on the p-type clad layer 43.

(d) The upper part of the second semiconductor layer 40 is partially removed by dry etching such as plasma etching for formation of the ridge 400. Specifically, for example, an SOG film is applied on the p-type contact layer 44, and then the SOG film is partially removed by photolithography with an SOG film 90 left in an area where the ridge 400 is to be formed, thus exposing a part of the surface of the second semiconductor layer 40.

Figure 15:
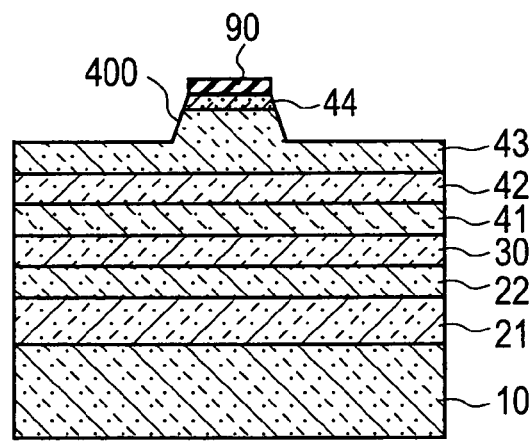

(e) As shown in FIG. 15, upper part of the p-type contact layer 44 and the p-type clad layer 43 is partially etched and removed using the SOG film 90 as a mask, thus forming the ridge 400.

Figure 16:
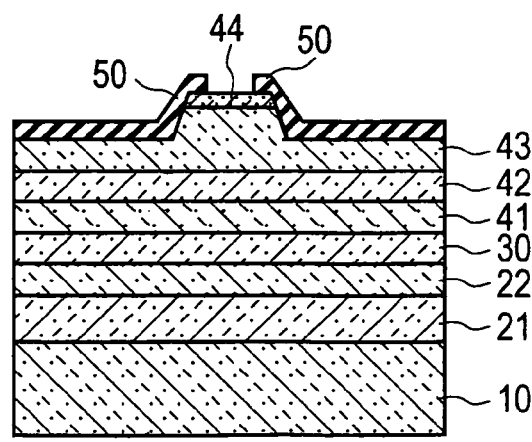

(f) Subsequently, as shown in FIG. 16, on the upper surface of the second semiconductor layer 40, the insulating film 50 is formed. For example, after an etching mask of a photo-resist film or the like is formed, an insulator thin film is formed so as to fully cover the grating layer 42, the p-type clad layer 43, and the p-type contact layer 44. The insulator thin film is lifted off to expose only the top surface of the p-type contact layer 44, thus forming the insulating film 50.

Figure 17:
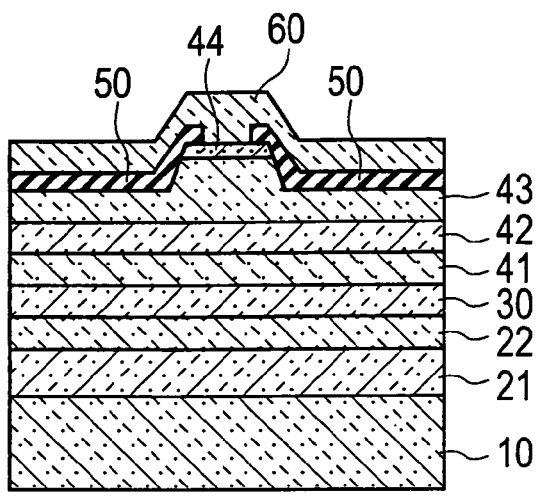

(g) On the insulating film 50, the p-side electrode 60 is formed in contact with the exposed top surface of the p-type contact layer 44, thus obtaining the structure section shown in FIG. 17. Furthermore, on the rear surface of the substrate 10, the n-side electrode 70 is formed.

As described above, the grating layer 42 is formed after the layers from the first semiconductor layer 20 to the GaN layer 42A are grown on the substrate 10, and the substrate 10 is then put again into a growing furnace to form the p-type clad layer 43 and the contact layer 44.

In the example described above, each of the grating units 421 to 42n has a structure in which the first region 42a composed of GaN and the second region 42b composed of AlGaN are adjacent to each other.

With reference to FIGS. 18 to 22, a description is given of an example of forming the grating layer 42 in which the first regions 42a of the grating units 421 to 42n are composed of GaN and the second regions 42b thereof are composed of an insulating film with a refractive index lower than that of GaN. FIGS. 18 to 22 show sections in the IV-IV direction of FIG. 1.

Figure 18:
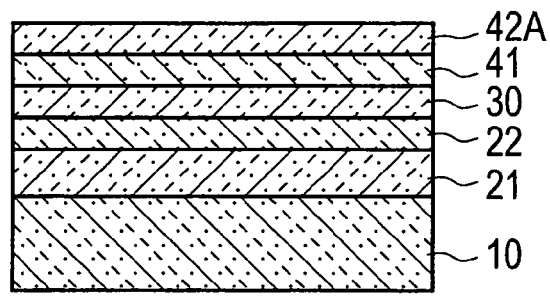
FIGS. 18 to 22 are process cross-sectional views for explaining another method of manufacturing the surface emitting laser diode according to the embodiment of the present invention.

(a) The n-type clad layer 21, the guide layer 22, the active layer 30, the p-type electron block layer 41, and a GaN layer 42A as the p-type guide layer are stacked on the main surface 11 of the substrate 10, thus obtaining the structure section shown in FIG. 18.

Figure 19:
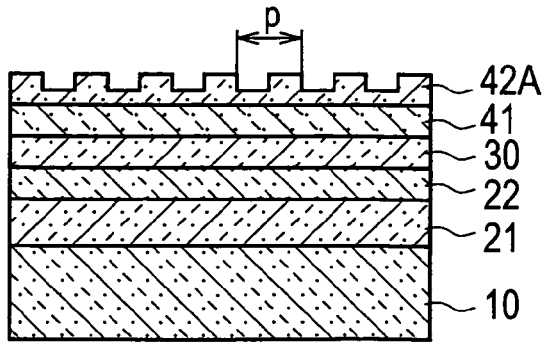

(b) As shown in FIG. 19, for example, a plurality of recesses extending in the radial direction of the second semiconductor layer 40 are formed in the surface of the GaN layer 42A by nano-imprint, UV photolithography, or electron beam lithography. The pitch of the recesses (arrangement pitch p) is set to a value satisfying the equation (2) as described in the explanation of FIG. 12.

Figure 20:
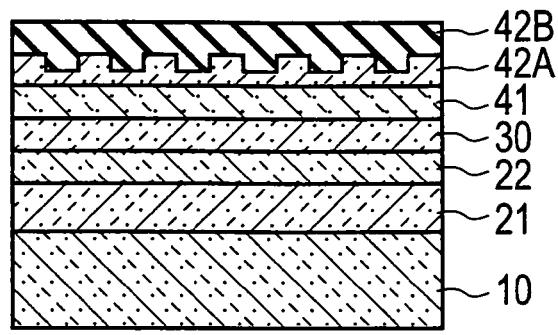

(c) As shown in FIG. 20, a low refractive index film 42B which has a refractive index lower than that of the GaN layer 42A, for example, such as an SOG or silicon oxide ($SiO_2$) film, is formed by sputtering or the like so as to fill the recesses formed in the surface of the GaN layer 42A.

Figure 21:
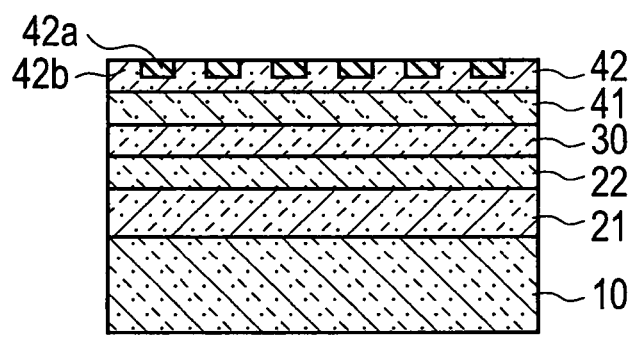

(d) Thereafter, the surface of the low refractive index film 42B is subjected to etching. Specifically, as shown in FIG. 21, the low refractive index film 42B is etched back so that the upper surface of the low refractive index film 42B is on the same level as the upper surface of the recesses of the GaN layer 42A, thus forming the grating layer 42. In other words, each of the second regions 42b of the grating layer 42 is composed a part of the GaN layer 42A, and each of the first regions 42a is composed of a part of the low refractive index film 42B.

Figure 22:
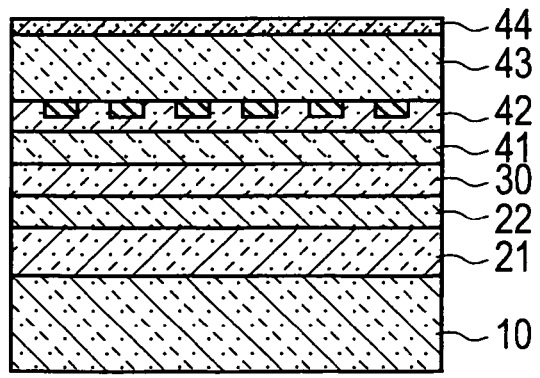

(e) As shown in FIG. 22, on the grating layer 42, the p-type clad layer 43 and the contact layer 44 are formed.

With reference to FIGS. 23 to 26, a description is given of another example of the method of forming the grating layer 42. FIGS. 23 to 26 are sections in the direction IV-IV of FIG. 1.

Figure 23:
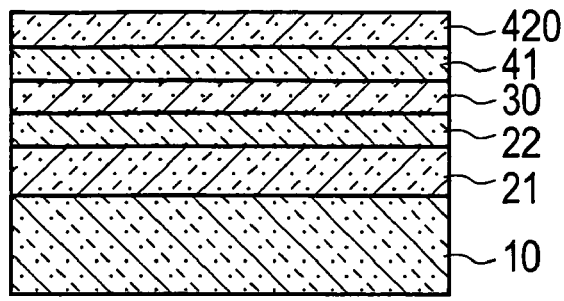
FIGS. 23 to 26 are process cross-sectional views for explaining still another method of manufacturing the surface emitting laser diode according to the embodiment of the present invention.

(a) The n-type clad layer 21, the guide layer 22, the active layer 30, and the p-type electron block layer 41, and a GaN layer 420 as the p-type light guide layer are stacked on the main surface 11 of the substrate 10, thus obtaining the structure section shown in FIG. 23.

Figure 24:
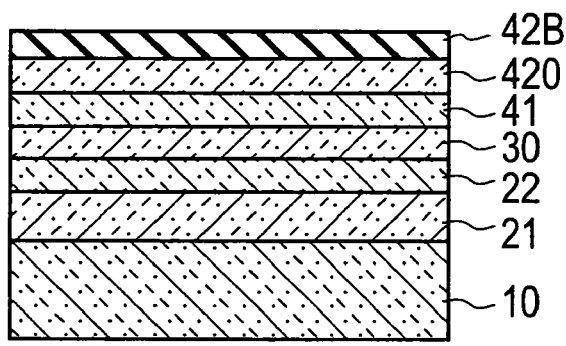

(b) As shown in FIG. 24, on a GaN layer 420, the low refractive index film 42B with a refractive index lower than AlGaN is formed by sputtering or the like. The low refractive index film 42B can be composed of an SOG film or the like, for example.

Figure 25:
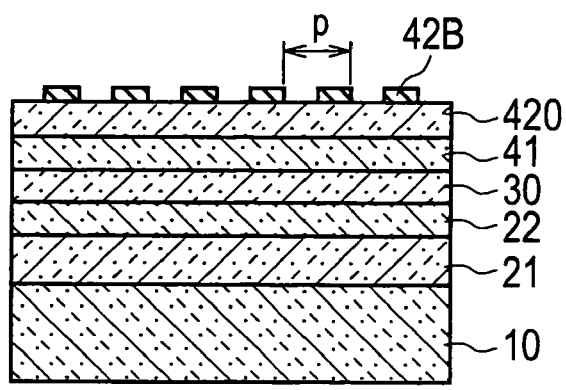
Figure 26:
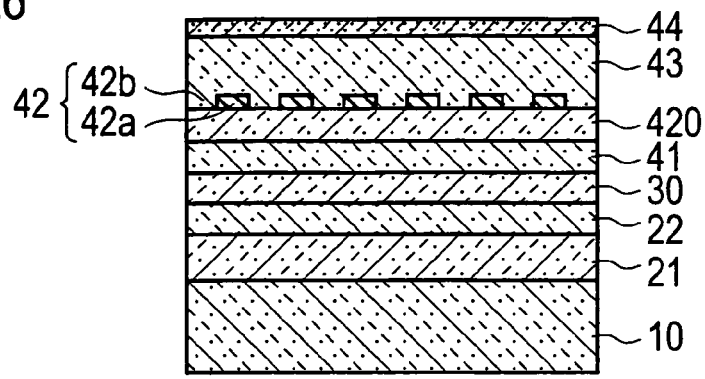

(c) As shown in FIG. 25, a plurality of recesses extending in the radial direction of the second semiconductor layer 40 are formed in the surface of the low refractive index film 42B by nano-imprint, UV photolithography, or electron beam lithography. When generating the RPB, the pitch of the recesses (arrangement pitch p) is set to a value satisfying the equation (2) as described in the explanation of FIG. 12.

(d) The p-type clad layer 43 composed of AlGaN is formed so as to fill the recesses formed in the surface of the low refractive index film 42B. Accordingly, the grating layer 42 is formed in which each of the first regions 42a is composed of a part of the low refractive index film 42B and each of the second regions 42b is composed of the part of AlGaN embedded in the recesses formed in the surface of the low refractive index film 42B serve as the second regions 42b. The p-type contact layer 44 is then formed on the p-type clad layer 43, thus obtaining the structure section shown in FIG. 26.

According to the method of manufacturing a surface emitting laser diode of the embodiment of the present invention described above, it is possible to form the grating layer 42 including the first and second regions 42a and 42b having different refractive indices. It is therefore possible to provide the surface emitting laser diode which outputs the annular RPB 100 polarized in the radial direction perpendicular to the main surface 11 of the substrate 10.

<First Modification>

Figure 27:
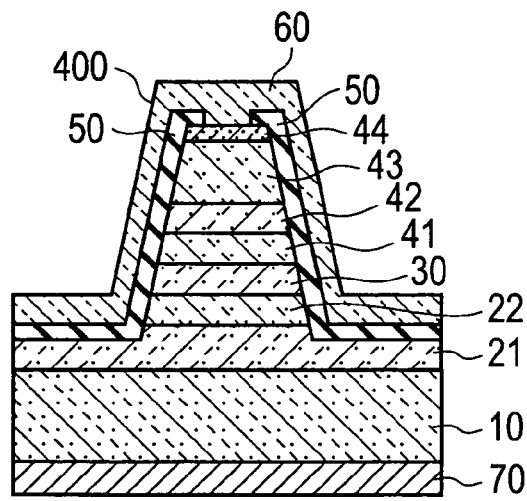
FIG. 27 is a schematic view showing a structure of a surface emitting laser diode according a first modification of the embodiment of the present invention.

FIG. 27 shows a surface emitting laser diode according to a first modification of the embodiment of the present invention. FIG. 27 shows a section of the ring-shaped surface emitting laser diode in the radial direction. The surface emitting laser diode shown in FIG. 27 is different from that shown in FIG. 1 in that the grating layer 42 is included in the ridge 400. In the surface emitting laser diode shown in FIG. 27, the light confinement effect in the lateral direction can be increased, and the optical loss can be reduced.

In the surface emitting laser diode shown in FIG. 1, the ridge 400 is formed by partially etching and removing upper part of the p-type contact and clad layers 44 and 43. On the other hand, the surface emitting laser diode shown in FIG. 27 can be formed by partially etching and removing the layers from the p-type contact layer 44 to the n-type clad layer 21.

<Second Modification>

Figure 28:
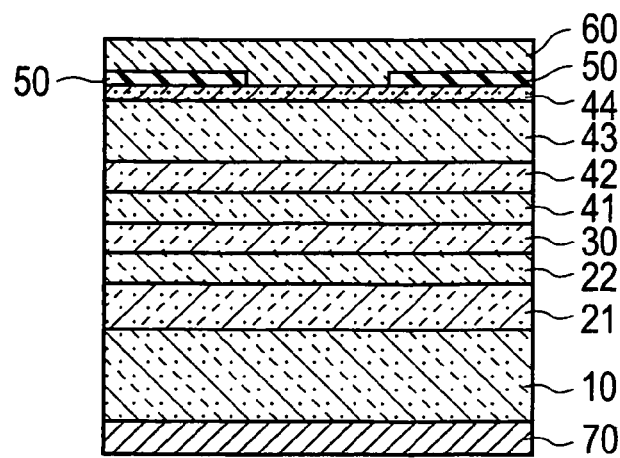
FIG. 28 is a schematic view showing a structure of a surface emitting laser diode according a second modification of the embodiment of the present invention.

FIG. 28 shows a surface emitting laser diode according to a second modification of the embodiment. FIG. 28 shows a section of the ring-shaped surface emitting laser diode in the radial direction. The surface emitting laser diode shown in FIG. 28 is different from that shown in FIG. 1 in that the surface emitting laser diode shown in FIG. 28 implements only gain guiding and does not include the ridge 400.

In the surface emitting laser diode shown in FIG. 28, the contact area between a second semiconductor layer and a p-side electrode is limited by the insulating film 50 for current confinement. Since the ridge 400 is not formed, the manufacturing process is simplified, and the mass-productivity can be increased.

Other Embodiments

In the description of the previously described embodiment, the p-side electrode 60 may be a metal electrode composed of, for example, an Al film or nickel (Ni)/Au alloy and die-bonded to a wiring substrate. At this time, the n-side electrode 70 is provided with an opening through which the RPB 100 is outputted.

Moreover, when the substrate 10 is a substrate which does not transfer current such as a sapphire substrate, the n-side electrode 70 may be arranged on a part of the surface of the first semiconductor layer 20 which is exposed by partially etching and removing the second semiconductor layer 40, active layer 30, and first semiconductor layer 20.

Various modifications will become possible for those skilled in the art after receiving the teachings of the present disclosure without departing from the scope thereof.

What is claimed is:

1. A surface emitting laser diode comprising:
a ring-shaped first semiconductor layer including an n-type clad layer;
a ring-shaped active layer provided on the first semiconductor layer; and
a ring-shaped second semiconductor layer which is provided on the active layer and includes a p-type clad layer and a grating layer including grating units continuously arranged in a circumferential direction, each grating unit including a plurality of regions having different refractive indices and being adjacent to each other in the circumferential direction, wherein
an arrangement pitch of the grating units, which is defined as a product of a radius of the second semiconductor layer and an angle between straight lines extending from a center of the second semiconductor layer to adjacent two grating units of the grating units, is equal to $2\pi/\beta$ where $\beta$ is a propagation coefficient of light which is generated at the active layer and propagates in the grating layer in the circumferential direction.

2. The surface emitting laser diode of claim 1, wherein the grating layer comprises:
a plurality of first stripe regions having a first refractive index and extending in a radial direction of the second semiconductor layer; and
a plurality of second regions which are individually provided between adjacent pairs of the plurality of first regions and have a second refractive index smaller than the first refractive index.

3. The surface emitting laser diode of claim 2, wherein the grating layer has a structure in which a semiconductor layer having the second refractive index fills recesses formed in a surface of a semiconductor layer having the first refractive index.

4. The surface emitting laser diode of claim 3, wherein the semiconductor layer having the second refractive index is the p-type clad layer.

5. The surface emitting laser diode of claim 1, wherein the active layer emits light polarized in the radial direction of the active layer.

6. The surface emitting laser diode of claim 5, wherein band gaps of the n-type clad layer and p-type clad layer are wider than a band gap of the active layer.

7. The surface emitting laser diode of claim 1, wherein the surface emitting laser diode includes a ridge formed by partially etching and removing upper part of the second semiconductor layer in a circumferential direction.

8. The surface emitting laser diode of claim 7, wherein the grating layer is included in the edge.

9. The surface emitting laser diode of claim 1, wherein the first semiconductor layer is provided on a gallium nitride substrate.

10. The surface emitting laser diode of claim 1, wherein the first semiconductor layer comprises an n-type guide layer provided between the n-type clad layer and the active layer.

11. The surface emitting laser diode of claim 1, wherein the second semiconductor layer comprises a p-type electron block layer provided between the active layer and the grating layer.

12. The surface emitting laser diode of claim 1, wherein the active layer has a quantum well structure including a plurality of barrier layers and a light emitting layer which is provided between the barrier layers and has a band gap smaller than a band gap of the barrier layers.

13. The surface emitting laser diode of claim 12, wherein the light emitting layer is composed of indium gallium nitride.

14. The surface emitting laser diode of claim 1, wherein the n-type clad layer has a superlattice structure including a plurality of AlGaN and GaN layers alternately stacked on each other.

15. The surface emitting laser diode of claim 1, wherein the p-type clad layer has a superlattice structure including a plurality of AlGaN and GaN layers alternately stacked on each other.

16. The surface emitting laser diode of claim 1, wherein each of the grating units has a structure including a first region having a first refractive index and a second region having a second refractive index different from the first refractive index and the first and second regions are adjacent to each other.

* * * * *